(12) United States Patent
Yang

(10) Patent No.: US 9,391,575 B1
(45) Date of Patent: Jul. 12, 2016

(54) ADAPTIVE LOUDNESS CONTROL

(71) Applicant: Amazon Technologies, Inc., Reno, NV (US)

(72) Inventor: Jun Yang, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 142 days.

(21) Appl. No.: 14/106,529

(22) Filed: Dec. 13, 2013

(51) Int. Cl.
*H03G 3/20* (2006.01)
*H03G 3/32* (2006.01)

(52) U.S. Cl.
CPC ... *H03G 3/20* (2013.01); *H03G 3/32* (2013.01)

(58) Field of Classification Search
None
See application file for complete search history.

(56) References Cited

U.S. PATENT DOCUMENTS

| | | | | |
|---|---|---|---|---|
| 3,989,897 | A * | 11/1976 | Carver | 381/94.3 |
| 4,790,015 | A * | 12/1988 | Callens et al. | 704/212 |
| 5,930,373 | A * | 7/1999 | Shashoua et al. | 381/98 |
| 6,839,438 | B1 * | 1/2005 | Riegelsberger et al. | 381/18 |
| 7,072,477 | B1 * | 7/2006 | Kincaid | 381/107 |
| 7,418,392 | B1 | 8/2008 | Mozer et al. | |
| 7,720,683 | B1 | 5/2010 | Vermeulen et al. | |
| 7,774,204 | B2 | 8/2010 | Mozer et al. | |
| 2003/0002688 | A1 * | 1/2003 | Kanevsky et al. | 381/74 |
| 2006/0072766 | A1 * | 4/2006 | Klein et al. | 381/66 |
| 2006/0262938 | A1 * | 11/2006 | Gauger et al. | 381/56 |
| 2007/0258607 | A1 * | 11/2007 | Purnhagen et al. | 381/307 |
| 2007/0291959 | A1 * | 12/2007 | Seefeldt | 381/104 |
| 2007/0291960 | A1 * | 12/2007 | Sekiguchi | 381/107 |
| 2008/0008336 | A1 * | 1/2008 | Tanaka et al. | 381/104 |
| 2008/0082327 | A1 * | 4/2008 | Murase et al. | 704/234 |
| 2008/0187149 | A1 * | 8/2008 | Jung | 381/72 |
| 2008/0267427 | A1 * | 10/2008 | Johnston | 381/101 |
| 2009/0010452 | A1 * | 1/2009 | Unno et al. | 381/94.1 |
| 2009/0190779 | A1 * | 7/2009 | Chung | 381/107 |
| 2010/0067709 | A1 * | 3/2010 | Seefeldt | 381/56 |
| 2011/0158432 | A1 * | 6/2011 | Lee et al. | 381/107 |
| 2011/0274293 | A1 * | 11/2011 | Yue | 381/107 |
| 2012/0016668 | A1 * | 1/2012 | Gao | 704/203 |
| 2012/0170769 | A1 * | 7/2012 | McGrath | 381/100 |
| 2012/0179456 | A1 * | 7/2012 | Ryu et al. | 704/200.1 |
| 2012/0223885 | A1 | 9/2012 | Perez | |
| 2013/0142360 | A1 * | 6/2013 | Potard | 381/98 |
| 2013/0202131 | A1 * | 8/2013 | Kemmochi et al. | 381/104 |
| 2014/0016791 | A1 * | 1/2014 | Smith et al. | 381/57 |
| 2014/0140537 | A1 * | 5/2014 | Soulodre | H03G 5/005 381/104 |
| 2014/0328500 | A1 * | 11/2014 | Patwardhan et al. | 381/107 |

FOREIGN PATENT DOCUMENTS

WO   WO2011088053 A2   7/2011

OTHER PUBLICATIONS

Pinhanez, "The Everywhere Displays Projector: A Device to Create Ubiquitous Graphical Interfaces", IBM Thomas Watson Research Center, Ubicomp 2001, Sep. 30-Oct. 2, 2001, 18 pages.

* cited by examiner

*Primary Examiner* — Peter Vincent Agustin
(74) *Attorney, Agent, or Firm* — Lee & Hayes, PLLC

(57) ABSTRACT

Loudness control is performed by estimating the energy and loudness of an audio signal. Loudness of the audio signal is determined by decomposing the audio signal into multiple frequency bands at different center frequencies. The energy of the audio signal in each frequency band is calculated and converted to a loudness, using a function that models human loudness perceptions of audio energies at different frequencies. The loudnesses are summed to obtain the total loudness of the audio signal. A signal gain is calculated as a function of a loudness setting provided by a human listener, the estimated signal energy, and the total loudness of the audio signal.

19 Claims, 4 Drawing Sheets

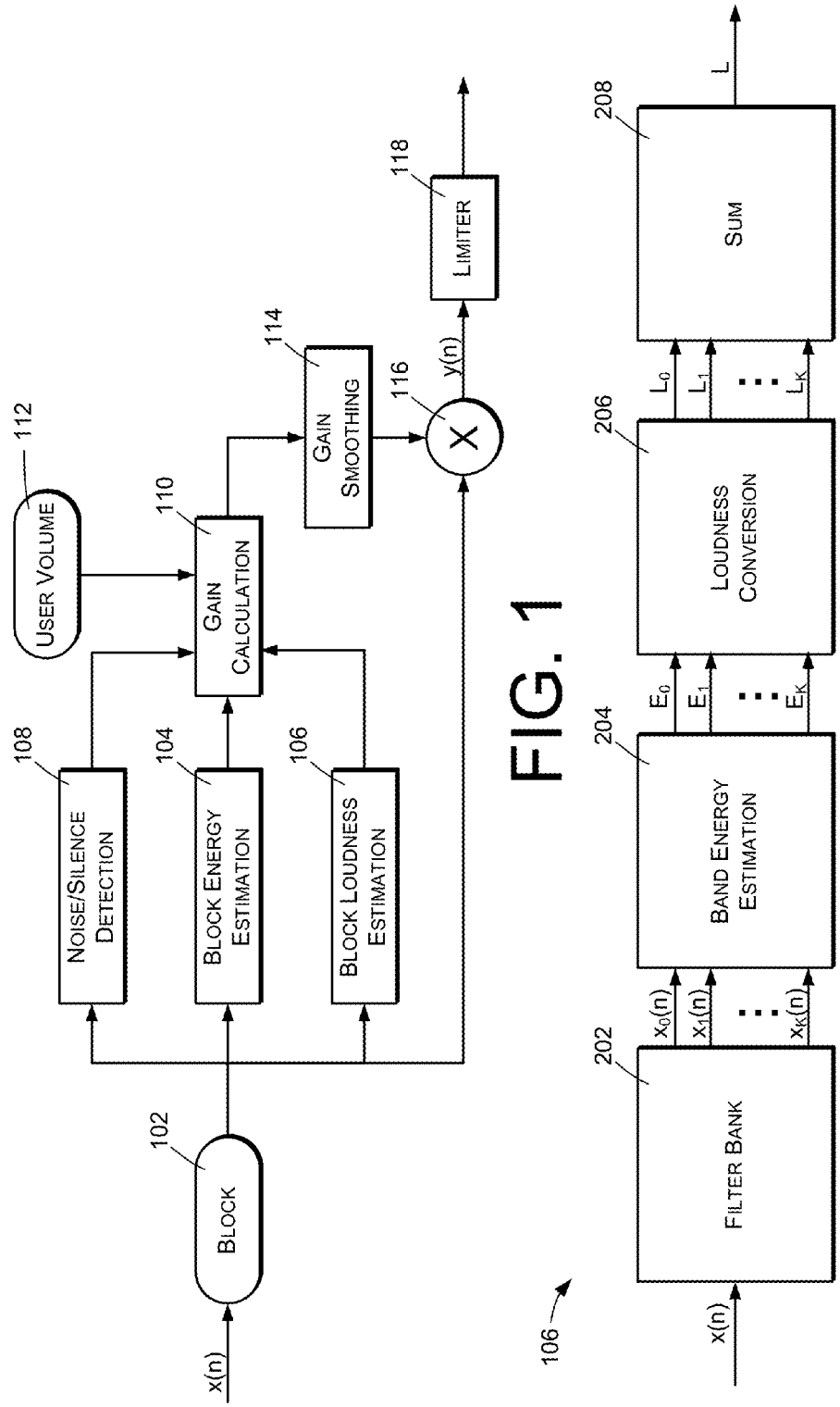

ADAPTIVE LOUDNESS CONTROL

BACKGROUND

Audio devices are often designed to receive and render audio content from different sources. Audio content such as this may exhibit widely varying audio levels, both within a particular piece of content and between different pieces of content. In spite of varying levels, it is often desired to produce a consistent and balanced experience for a listener, in which perceived audio volumes remain relatively constant.

In some systems, such as voice communication systems, loudspeaker output needs to sound as loud as possible. However, increasing loudspeaker volumes may introduce output non-linearities due to signal distortions, mechanical vibrations, and other factors. Such non-linearities may degrade the listening experience, and may also impact the performance of signal processing activities such as echo cancellation.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 1 is a block diagram illustrating logical component for balanced loudness control of an audio signal.

FIG. 2 is a block diagram illustrating logical components for evaluating loudness of the audio signal.

DETAILED DESCRIPTION

Figure 3:
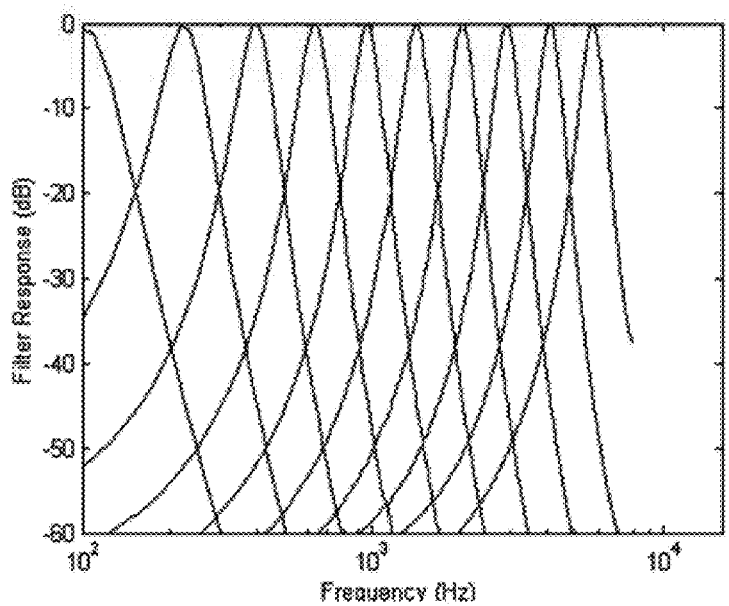
FIG. 3 is a graph illustrating an example of frequency responses for band filters of a filter bank. The horizontal axis corresponds to frequency and the vertical axis corresponds to decibels.

Described herein are techniques for producing audio outputs that may be adjusted to obtain consistent and relatively high loudnesses without introducing non-linearities that might otherwise interfere with echo cancellation and other types of signal processing. The described techniques produce a consistent and balanced sonic experience for a listener, independent of audio volume differences within and between different types and pieces of audio content.

In accordance with embodiments described below, a signal gain is calculated as a function of the energy of an input audio signal, the equivalent loudness of the input audio signal, and a volume input. The signal gain is applied to the input signal to produce an output signal that drives a loudspeaker.

The term "loudness" refers to the perception of sound by a human listener, which may differ from energy or sound pressure levels (SPLs) of the sound. The perceived loudness of sound at a given SPL varies with the frequency of the sound. The relationship between SPL and perceived loudness is sometimes represented as a set of equal-loudness contours that are determined experimentally by testing human listeners' perceptions of sounds at different frequencies. An SPL at a given frequency can be converted to loudness using a non-linear transfer function that models such experimentally determined equal-loudness contours over different frequencies.

To determine loudness of an input audio signal having multiple frequencies, the signal is filtered by a bank of bandpass filters centered at different frequencies. The energy of each resulting signal is calculated and then converted to loudness. The resulting loudness values are then summed to represent a total or composite loudness of the input audio signal.

In some embodiments, silence detection and noise detection may be used in order to avoid amplifying silence or noise. When silence or noise are detected, the signal gain is limited or set to a low value.

FIG. 1 shows logical components of a signal processing device or system for processing an input audio signal in order to produce a loudness controlled output signal.

An input audio signal x(n) is received from an audio source (not shown). In the examples described herein, the audio signal x(n) comprises a series of digital amplitude values. The amplitude values may be arranged and operated on in sequential blocks 102, where each block 102 contains a number N (N=128 or N=256, as examples) of the amplitude values. The nomenclature "x(n)" indicates the $n^{th}$ value of a sequence x of digital amplitude values. The $m^{th}$ block is denoted as $[x_m(0), x_m(1), \ldots, x_m(N-1)]$. The logical processing components of FIG. 1 operate on the values $[x(0), x(1), \ldots, x(N-1)]$ of an individual block 102.

An energy estimation component 104 receives the block 102 of input signal values and estimates the energy exhibited by the values of the block 102 of the input audio signal x(n). The signal energy E may be calculated as the square root of the summed squares of input values x(n), divided by the number N of block values:

$$E = \sqrt{x_m^2(0) + x_m^2(1) + \ldots + x_m^2(N-1)}/N$$

A block loudness estimation component 106 receives the block 102 of input signal values and estimates the loudness L represented by the values of the block 102. The loudness can be calculated by decomposing the input signal x(n) into frequency components, calculating the energy of each frequency component, converting each calculated energy to a loudness, and summing the loudnesses. This process will be described in more detail below, with reference to FIG. 2.

A noise/silence detection component 108 receives the block 102 and detects audio silence or audio noise in the audio signal represented by the block 102. Audio silence refers to an absence of audio in the audio signal. Periods of audio silence are demonstrated by relatively low signal dynamics. Audio noise refers to undesired audio that is not intended to be part of the audio. Audio noise may be introduced to an audio signal by the presence of background noise, by electronic components, by transmission media, by electromagnetic interference, etc.

In one embodiment, the short time zero crossing rate (ZCR) of the input signal x(n) is determined and used as an indication of noise. This may be performed by (a) counting the number of zero crossings in the block 102 of input values and normalizing this number by the block size N so as to obtain the instantaneous ZCR which is between 0.0 and 1.0, (b) smoothing the instantaneous ZCR to obtain the smoothed ZCR, and (c) comparing the smoothed ZCR to a reconfigurable threshold. If the smoothed ZCR exceeds the threshold (say, 0.8), the block may be judged as likely to represent noise.

Dynamics estimation may be used by the noise/silence detection component as an indication of either audio noise or silence. Dynamics estimation may be performed by (a) estimating a level envelope of the audio signal x(n) with a fast attack and slow release filter, (b) estimating the level floor of the audio signal x(n) with a slow attack and fast release filter, (c) calculating the ratio between the envelope and the floor. This ratio is then compared to a threshold. If the ratio is less than the threshold, the block 102 has low or small dynamics and may judged as likely to represent either noise or silence.

In one embodiment, the noise/silence detection component 108 may be configured to combine the zero crossing rate and dynamics estimations in order to provide an indication that the input block 102 contains either noise or silence. Specifically, an input block 102 is considered to represent noise and/or silence when the zero crossing rate is high and the signal dynamics are low.

A gain calculation component 110 receives the calculated signal energy E from the energy estimation component 104, the block loudness L from the block loudness estimation component 106, and indications of audio silence or audio noise from the noise/silence detection component 108. In addition, the gain calculation component 110 receives a volume input or setting 112. The volume input 112 represents an adjustable volume or loudness level specified or provided by a human listener, such as by adjusting a volume control of a device.

The gain calculation component 110 calculates a signal gain as a product of the volume input 112 and a ratio of the block loudness L to the signal energy E as follows:

$$\text{gain} = c \ast L/E$$

where c is the volume input, which ranges from 0% to 100%. The gain is limited to a maximum value $g_{max}$. The maximum gain $g_{max}$ may be set at approximately 8.0, i.e., 18 dB, in certain embodiments. In addition, the gain is reduced or otherwise limited during periods of silence or noise. Specifically, when the noise/silence detection component 108 detects audio noise or silence and the gain is above a predefined constant (say, 0.5), the gain reduced to the value of the constant. As another example, the gain may be limited to being no greater than a constant value such as 0.5 or $0.5 \ast g_{max}$.

A gain smoothing component 114 receives and smoothes or averages the calculated gain over time. As an example, the gain may be smoothed as follows:

$$g(n) = \alpha \ast g(n-1) + (1-\alpha) \ast \text{gain}$$

The smoothed gain g(n) is applied to each value of the input signal x(n) by a multiplier or amplification component 116. A limiter 118 processes the output signal y(n) to prevent the system output from clipping.

FIG. 2 illustrates an example implementation of the block loudness estimation component 106. A filter bank 202 receives the values x(n) of the block 102. The filter bank 202 comprises a set of K band-pass filters, each of which is centered at a different frequency. For example, the filters may be centered at the first 16 or 24 critical bands of human hearing in accordance with what is known as the Bark scale. In certain embodiment, the filter bank 202 may comprise an auditory filter bank.

FIG. 3 shows an example of a frequency response such as might be exhibited by the filters of the filter bank 202.

The filter bank 202 produces a plurality of filtered signals $X_0(n)$ through $x_K(n)$, corresponding to the K filters of the filter bank 202. These signals are received by a band energy estimation component 204, which is configured to estimate the energy of each of the filtered signals. This produces band energies $E_0$ through $E_K$, each of which corresponds to a different frequency band. The band energy $E_i$ for a given filtered signal $x_i(n)$ may be calculated as a function of the square root of the summed squares of the individual values of the block m as follows:

$$E_i = 20 \times lg(\sqrt{x_m^2(i,0) + x_m^2(i,1) + \ldots + x_m^2(i,N-1)}/N)$$

A loudness conversion component 206 receives the band energies $E_0$ through $E_K$ and converts each of the band energies to a loudness or loudness value. The conversion may be performed in accordance with a function that models human loudness perceptions of audio energies at different frequencies. A function such as this may be derived based on equal-loudness contours as described above, which have been experimentally determined using human test subjects. Such a function converts a band energy to a loudness value that represents a perceived loudness of the frequency band energy by a human.

Figure 4:
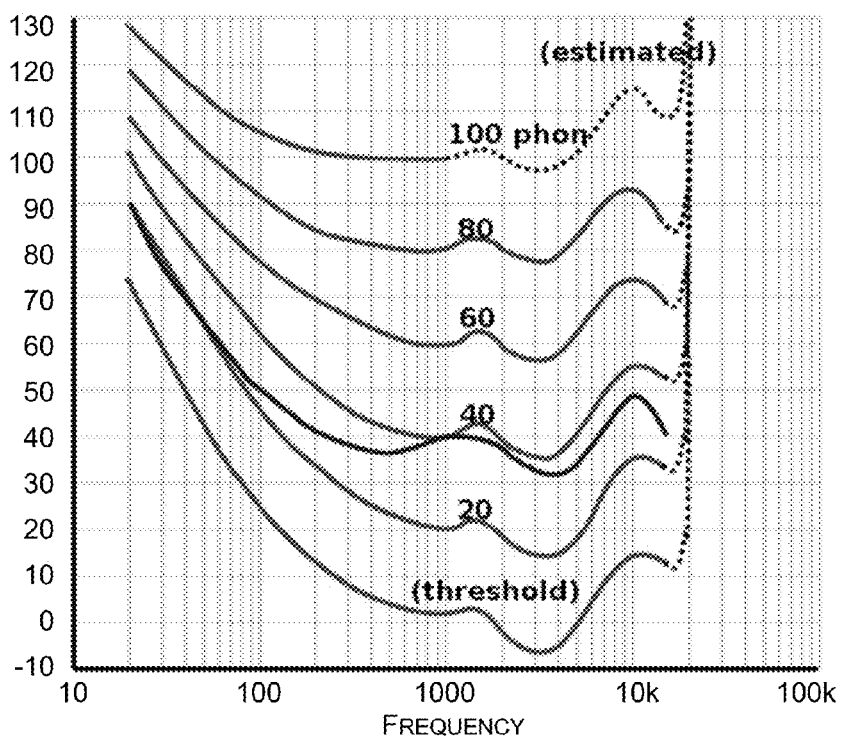
FIG. 4 is a graph illustrating equal-loudness curves at various loudness levels. The horizontal axis corresponds to frequency and the vertical axis corresponds to sound pressure level.

FIG. 4 shows an example of equal-loudness contours for different phon levels. The phon is a unit of measurement for indicating loudness based on human perception. FIG. 4 shows, for each phon level, the SPL that produces an equally loud perception across a range of frequencies.

Although different functions are available for converting sound energy or pressure to loudness, the following example function may be used to calculate the loudness $L_i$ in phons based on a band energy $E_i$ in a frequency band having a center frequency f:

$$L_i = 4.2 + \frac{a(f)(E_i - T(f))}{1 + b(f)(E_i - T(f))}$$

where:
f is the center frequency of the $i^{th}$ frequency band;
$E_i$ is the calculated band energy of the $i^{th}$ frequency band; and $$a(f) = -3.3378 \ast 10^{-19} f^5 + 1.0889 \ast 10^{-14} f^4 -$$
$$1.2776 \ast 10^{-10} f^3 + 6.5607 \ast 10^{-7} f^2 - 0.0014 f + 1.8113$$
$$b(f) = -9.1993 \ast 10^{-22} f^5 + 3.1889 \ast 10^{-17} f^4 -$$
$$4.0519 \ast 10^{-13} f^3 + 2.3588 \ast 10^{-9} f^2 - 5.9306 f + 0.0040$$
$$T(f) = 9.3706 \ast 10^{-21} f^6 - 3.0490 \ast 10^{-16} f^5 + 4.1801 \ast 10^{-12} f^4 -$$
$$2.6922 \ast 10^{-8} f^3 + 8.3228 \ast 10^{-5} f^2 - 0.1115 f + 46.48$$

Referring again to FIG. 2, a summing component 208 receives and sums the band loudnesses or loudness values $L_0$ through $L_K$ to produce a total signal loudness L.

Figure 5:
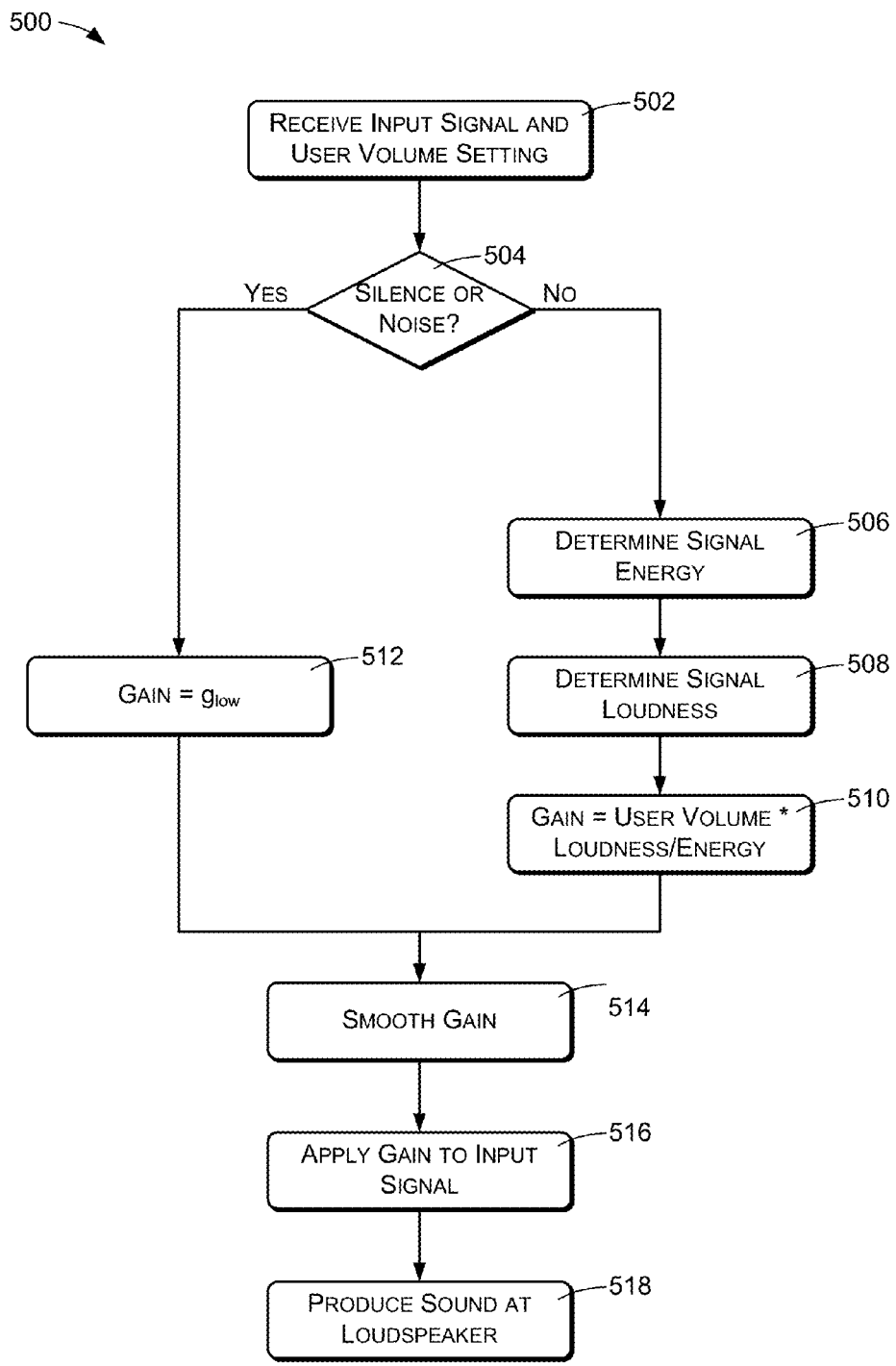
FIG. 5 is a flowchart illustrating an example process for controlling the loudness of an audio signal.

FIG. 5 illustrates an example process 500 for controlling loudness of an audio signal. An action 502 comprises receiving an input audio signal and a loudness value specified by a human listener. The loudness value may also be referred to herein as a volume input.

In the described embodiments the input audio signal comprises a digital signal having blocks of amplitude values. Other types of signals, such as analog signals, may be received in different embodiments.

An action 504 comprises determining whether the input audio signal currently represents audio noise or audio silence. This may be performed by detecting audio silence and/or audio noise in the input audio signal as described above with reference to the noise/silence detection component 108.

If neither audio noise nor audio silence is detected in the input audio signal, actions 506, 508, and 510 are performed to calculate a preliminary signal gain. The action 506 comprises determining the signal energy E of the input audio signal, which may in some embodiments be performed as described above with reference to the energy estimation component 104.

The action 508 comprises determining a signal loudness L of the input audio signal. As described above with reference to FIG. 2, determining the signal loudness L may comprise analyzing the input audio signal at different frequencies.

The action 510 comprises calculating the preliminary signal gain as a function of the volume setting, the input signal energy E, and the input signal loudness L. In some embodiments, the preliminary signal gain may be calculated by multiplying the volume setting by a ratio of the signal loudness L to the signal energy E.

If the received input audio signal represents noise and/or silence, an action 512 is performed. The action 512 comprises limiting the preliminary signal gain, which in some embodiments may comprise setting the preliminary signal gain to a constant value (say, 0.5) or lower value, such as $0.05 * g_{max}$.

After determining the preliminary signal gain as described above, an action 514 comprises smoothing the preliminary signal gain over time to produce a smoothed signal gain. The smoothing may be accomplished by applying a smoothing function to consecutive values of the preliminary signal gain.

An action 516 comprises applying the smoothed signal gain to the input audio signal to produce an output audio signal. This may comprise multiplying or amplifying individual values of the input audio signal by the smoothed signal gain.

An action 518 comprises providing the output audio signal to a loudspeaker to produce sound from the loudspeaker. Note that the output signal may be further processed in order to drive the loudspeaker. For example, the output signal may be converted to an analog signal and amplified.

Figure 6:
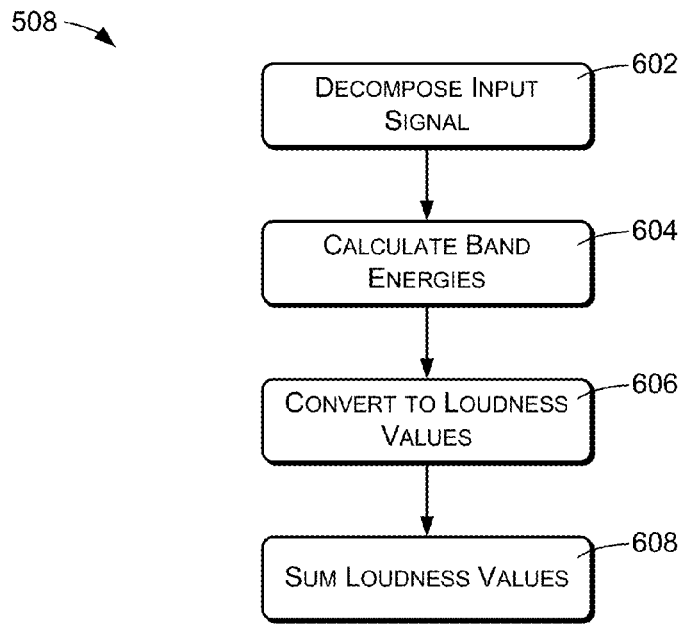
FIG. 6 is a flowchart illustrating an example process for determining the loudness of an audio signal.

FIG. 6 illustrates further details regarding the action 508 of determining signal loudness. An action 602 comprises decomposing the input audio signal into a plurality of frequency components. This may be performed, as described above with reference to FIG. 2, by filtering the input audio signal with a plurality of band-pass filters to produce a plurality of filtered signals corresponding respectively to different frequency bands.

An action 604 comprises analyzing each of the filtered signals to determine or calculate a band energy of the input signal for each of the multiple frequency bands. This may be performed by calculating the energies of the filtered signals. The energy of a filtered signal may be calculated as a function of the square root of the sum of squared amplitude values of the filtered signals.

An action 606 comprises converting each of the band energies to a corresponding band loudness or loudness value. This may be performed in accordance with a function that models human loudness perceptions of audio energies at different frequencies, as described above with reference to FIG. 4.

An action 608 comprises determining the total loudness L of the input audio signal by summing the band loudnesses calculated in the action 606.

Figure 7:
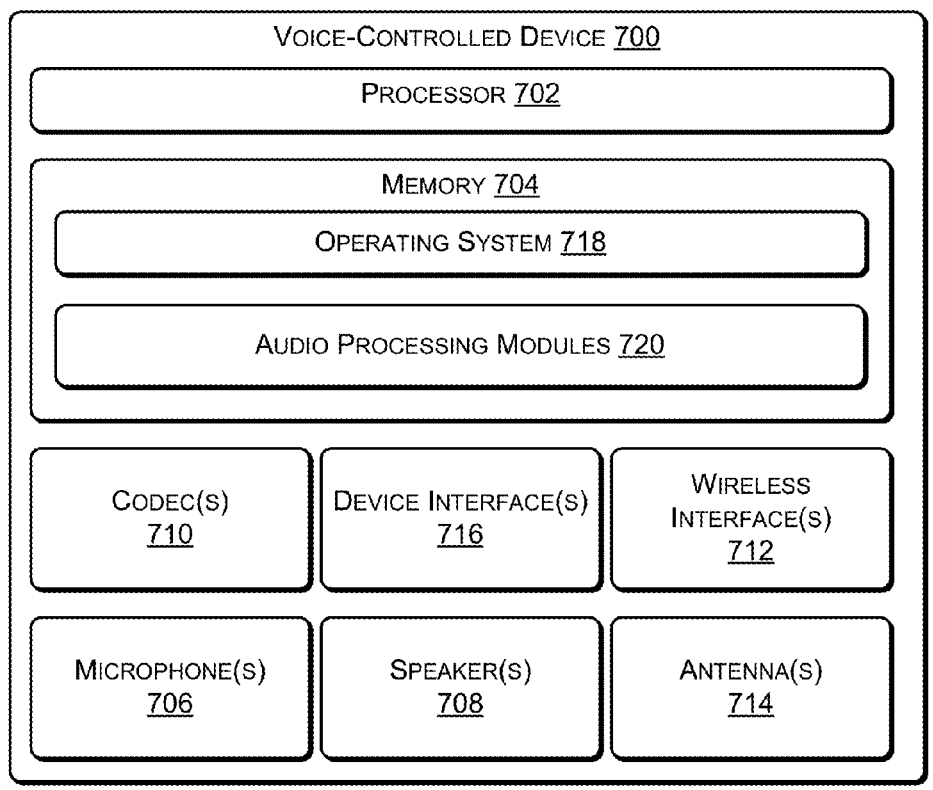
FIG. 7 is a block diagram of a system that may be used to apply loudness control in accordance with the techniques described herein.

FIG. 7 shows an example of an audio system, element, or component that may be configured to perform loudness control in accordance with the techniques described above. In this example, the audio system comprises a voice-controlled device 700 that may function as an interface to an automated system. However, the devices and techniques described above may be implemented in a variety of different architectures and contexts. For example, the described adaptive loudness control may be used in various types of devices that perform audio processing, including mobile phones, entertainment systems, communications components, and so forth.

The voice-controlled device 700 may in some embodiments comprise a module that is positioned within a room, such as on a table within the room, which is configured to receive voice input from a user and to initiate appropriate actions in response to the voice input. In the illustrated implementation, the voice-controlled device 700 includes a processor 702 and memory 704. The memory 704 may include computer-readable storage media ("CRSM"), which may be any available non-transitory physical media accessible by the processor 702 to execute instructions stored on the memory 704. In one basic implementation, CRSM may include random access memory ("RAM") and flash memory. In other implementations, CRSM may include, but is not limited to, read-only memory ("ROM"), electrically erasable programmable read-only memory ("EEPROM"), or any other medium which can be used to store the desired information and which can be accessed by the processor 702.

The voice-controlled device 700 includes a microphone unit that comprises one or more microphones 706 to receive audio input, such as user voice input. The device 700 also includes a loudspeaker unit that includes one or more loudspeakers 708 to output audio sounds. One or more codecs 710 are coupled to the microphone(s) 706 and the loudspeaker(s) 708 to encode and/or decode audio signals. The codec(s) 710 may convert audio data between analog and digital formats. A user may interact with the device 700 by speaking to it, and the microphone(s) 706 captures sound and generates an audio signal that includes the user speech. The codec(s) 710 encodes the user speech and transfers that audio data to other components. The device 700 can communicate back to the user by emitting audible sounds or speech through the loudspeaker(s) 708. In this manner, the user may interacts with the voice-controlled device 700 simply through speech, without use of a keyboard or display common to other types of devices.

In the illustrated example, the voice-controlled device 700 includes one or more wireless interfaces 712 coupled to one or more antennas 714 to facilitate a wireless connection to a network. The wireless interface(s) 712 may implement one or more of various wireless technologies, such as wifi, Bluetooth, RF, and so forth.

One or more device interfaces 716 (e.g., USB, broadband connection, etc.) may further be provided as part of the device 700 to facilitate a wired connection to a network, or a plug-in network device that communicates with other wireless networks.

The voice-controlled device 700 may be designed to support audio interactions with the user, in the form of receiving voice commands (e.g., words, phrase, sentences, etc.) from the user and outputting audible feedback to the user. Accordingly, in the illustrated implementation, there are no or few haptic input devices, such as navigation buttons, keypads, joysticks, keyboards, touch screens, and the like. Further there is no display for text or graphical output. In one implementation, the voice-controlled device 700 may include non-input control mechanisms, such as basic volume control button(s) for increasing/decreasing volume, as well as power and reset buttons. There may also be one or more simple light elements (e.g., LEDs around perimeter of a top portion of the device) to indicate a state such as, for example, when power is on or to indicate when a command is received. But, otherwise, the device 700 does not use or need to use any input devices or displays in some instances.

Several modules such as instruction, datastores, and so forth may be stored within the memory 704 and configured to execute on the processor 702. An operating system module 718, for example, may be configured to manage hardware and services (e.g., wireless unit, Codec, etc.) within and coupled to the device 700 for the benefit of other modules. In addition, the memory 704 may include one or more audio processing modules 720, which may be executed by the processor 702 to perform the methods described herein, as well as other audio processing functions. In some cases, the processor 702 may include one or more digital signal processors for use by the audio processing modules 720, and the digital signal processors may be configured by way of programs and instructions to perform the methods and techniques described herein.

Although the example of FIG. 7 shows a programmatic implementation, the functionality described above may be performed by other means, including non-programmable elements such as analog components, discrete logic elements, and so forth. Thus, in some embodiments various ones of the components, functions, and elements described herein may be implemented using programmable elements such as digital signal processors, analog processors, and so forth. In other embodiments, one or more of the components, functions, or elements may be implemented using specialized or dedicated circuits. The term "component", as used herein, is intended to include any hardware, software, logic, or combinations of the foregoing that are used to implement the functionality attributed to the component.

Although the discussion above sets forth example implementations of the described techniques, other architectures may be used to implement the described functionality, and are intended to be within the scope of this disclosure. Furthermore, although specific distributions of responsibilities are defined above for purposes of discussion, the various functions and responsibilities might be distributed and divided in different ways, depending on circumstances.

Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method, comprising:
  receiving an input audio signal;
  determining a signal energy of the input audio signal;
  determining a band energy of the input audio signal for each of multiple frequency bands of the input audio signal;
  converting each band energy to a corresponding band loudness to produce multiple band loudnesses;
  summing the multiple band loudnesses to produce a signal loudness;
  receiving a loudness value specified by a human listener, wherein the loudness value indicates a desired relative audio loudness;
  multiplying the loudness value by a ratio of the signal loudness to the signal energy to produce a signal gain;
  amplifying the input audio signal by the signal gain to produce an output audio signal; and
  providing the output audio signal to a loudspeaker.

2. The method of claim 1, further comprising:
  determining whether a zero crossing rate of the audio input signal exceeds a first threshold;
  determining whether a dynamic level of the audio input exceeds a second threshold;
  determining whether the signal gain exceeds a predefined value;
  if the zero crossing rate exceeds the first threshold, the dynamic level does not exceed the second threshold, and the signal gain exceeds the predefined value, reducing the signal gain to the predefined value.

3. The method of claim 1, wherein the converting is performed in accordance with a function that models human loudness perceptions of audio energies at multiple frequencies, wherein the function converts each band energy to a loudness value that represents a perceived loudness of the band energy by a human.

4. The method claim 1, wherein:
  the input audio signal comprises a plurality of amplitude values; and
  determining the signal energy comprises calculating a square root of a sum of squares of the amplitude values.

5. The method of claim 1, wherein determining the band energy of the input audio signal for each of multiple frequency bands comprises:
  filtering the input audio signal with a plurality of band-pass filters to produce a plurality of filtered signals corresponding respectively to the frequency bands, wherein each of the filtered signals comprises a plurality of amplitude values; and
  for each filtered signal, calculating a square root of a sum of squares of the amplitude values of the filtered signal.

6. A device, comprising:
  one or more processors;
  computer-readable media storing instructions that are executable by the one or more processors to perform acts comprising:
    receiving an input audio signal;
    determining a signal energy of the input audio signal;
    analyzing the input audio signal at different frequencies of the input audio signal to determine a signal loudness;
    receiving an input signal specifying a loudness value;
    determining a signal gain based on the signal loudness and a product of the loudness value and the signal energy; and
    applying the signal gain to the input audio signal to produce an output audio signal.

7. The device of claim 6, wherein the signal gain is a ratio of the product over the signal energy.

8. The device of claim 6, wherein analyzing the input audio signal comprises:
  filtering the input audio signal with a plurality of band-pass filters to produce a plurality of filtered signals corresponding respectively to different frequency bands;
  analyzing each of the filtered signals to determine a corresponding band energy;
  converting each of the band energies to a corresponding band loudness; and
  summing the band loudnesses.

9. The device of claim 8, wherein the converting is performed in accordance with a function that models human loudness perceptions of audio energies at different frequencies.

10. The device of claim 6, wherein:
  the input audio signal comprises a plurality of amplitude values; and determining the signal energy comprises calculating a square root of a sum of squares of the signal amplitude values.

11. The device of claim 6, wherein analyzing the input audio signal comprises:
  filtering the input audio signal with a plurality of band-pass filters to produce a plurality of filtered signals corresponding respectively to different frequency bands, wherein each of the filtered signals comprises a plurality of amplitude values;
  for each filtered signal, calculating a square root of a sum of squares of the amplitude values of the filtered signal to produce multiple loudness values; and
  summing the loudness values.

12. The device of claim 6, the acts further comprising:
  detecting audio silence in the input audio signal;
  detecting audio noise in the input audio signal;
  limiting the signal gain in response to detecting the audio silence or the audio noise in the input audio signal.

13. A method, comprising:
  determining a signal energy of an input audio signal;
  analyzing the input audio signal to produce a signal loudness;
  determining a preliminary value of a signal gain as a function of the signal energy and the signal loudness, wherein the preliminary value of the signal gain is based at least in part on multiplying a loudness value by a ratio of the signal loudness to the signal energy;
  adjusting the signal gain by applying a function to consecutive values associated with the preliminary value; and
  applying the signal gain to the input audio signal to produce an output audio signal.

14. The method of claim 13, wherein analyzing the input audio signal comprises:
  determining a band energy of the input audio signal for each of a plurality of frequency bands;
  converting each of the band energies to a corresponding band loudness; and
  summing the band loudnesses.

15. The method of claim 14, wherein the converting is performed in accordance with a function that models human loudness perceptions of audio energies at different frequencies.

16. The method of claim 13, wherein analyzing the input audio signal comprises:
  filtering the input audio signal with a plurality of band-pass filters to produce a plurality of filtered signals corresponding respectively to different frequency bands;
  analyzing each of the filtered signals to determine a corresponding band energy;
  converting each band energy to a corresponding band loudness; and
  summing the band loudnesses.

17. The method of claim 13, wherein analyzing the input audio signal comprises:
  filtering the input audio signal with a plurality of band-pass filters to produce a plurality of filtered signals corresponding respectively to different frequency bands, wherein each of the filtered signals comprises a plurality of amplitude values; and
  for each filtered signal, calculating a square root of a sum of squares of the amplitude values of the filtered signal.

18. The method of claim 13, wherein analyzing the input audio signal comprises:
  filtering the input audio signal with a plurality of band-pass filters to produce a plurality of filtered signals corresponding respectively to different frequency bands, wherein each of the filtered signals comprises a plurality of amplitude values;
  for each filtered signal, calculating a square root of a sum of squares of the amplitude values of the filtered signal to produce multiple loudness values; and
  summing the loudness values.

19. The method of claim 13, further comprising:
  detecting audio silence in the input audio signal;
  detecting audio noise in the input audio signal;
  limiting the signal gain in response to detecting the audio silence or audio noise in the input audio signal.

* * * * *